(12) United States Patent
Foutz et al.

(10) Patent No.: US 10,955,470 B1
(45) Date of Patent: Mar. 23, 2021

(54) METHOD TO IMPROVE TESTABILITY USING 2-DIMENSIONAL EXCLUSIVE OR (XOR) GRIDS

(71) Applicant: CADENCE DESIGN SYSTEMS, INC., San Jose, CA (US)

(72) Inventors: Brian Edward Foutz, Charlottesville, VA (US); Christos Papameletis, Binghamton, NY (US); Vivek Chickermane, Slaterville Springs, NY (US); Krishna Vijaya Chakravadhanula, Vestal, NY (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 137 days.

(21) Appl. No.: 16/218,954

(22) Filed: Dec. 13, 2018

(51) Int. Cl.
| | | |
|---|---|---|
| *G01R 31/3177* | (2006.01) | |
| *G01R 31/317* | (2006.01) | |
| *G06F 30/33* | (2020.01) | |
| *G06F 30/392* | (2020.01) | |
| *G06F 30/398* | (2020.01) | |

(52) U.S. Cl.
CPC ... *G01R 31/3177* (2013.01); *G01R 31/31704* (2013.01); *G01R 31/31707* (2013.01); *G06F 30/33* (2020.01); *G06F 30/392* (2020.01); *G06F 30/398* (2020.01)

(58) Field of Classification Search
None
See application file for complete search history.

(56) References Cited

U.S. PATENT DOCUMENTS

| | | | | |
|---|---|---|---|---|
| 6,243,839 B1* | 6/2001 | Roohparvar | ........... | G11C 29/34 |
| | | | | 365/185.29 |
| 9,465,896 B1* | 10/2016 | Cunningham | ..... | G01R 31/2884 |
| 9,501,590 B1* | 11/2016 | Cunningham | ... | G01R 31/31704 |
| 9,513,335 B1* | 12/2016 | Wilcox | .......... | G01R 31/318547 |

* cited by examiner

*Primary Examiner* — Phung M Chung
(74) *Attorney, Agent, or Firm* — Tarolli, Sundheim, Covell & Tummino LLP

(57) ABSTRACT

Methods and design system for generating 2-dimensional distribution architecture for testing integrated circuit design that utilizes double grid to minimize interdependencies between grid cells and the associated functional logic to facilitate the a physically efficient scan of integrated circuit designs, that simultaneously minimizes required test application time ("TAT"), test data volume, tester memory and cost associated with design for test ("DFT"), while also retaining test coverage. An additional grid parallel to a 2-dimensional XOR grid may be implemented that improves the quality of test coverage by optimally adding additional data inputs which decreases correlations between grid cells. A column spreader may feed data into column wires and row spreader may feed data into column wires. The double grid allows data to be fed into two wires, row and column, respectively, which provides twice as much stimulus data in each direction, without significantly increasing the wiring used to build the grid.

9 Claims, 7 Drawing Sheets

METHOD TO IMPROVE TESTABILITY USING 2-DIMENSIONAL EXCLUSIVE OR (XOR) GRIDS

TECHNICAL FIELD

The present invention relates to methods and a design system for testing integrated circuit designs; the invention also relates to an integrated circuit implementing a physically efficient scan that optimally retains test coverage by implementing a two-dimensional double grid that divides testable logic.

BACKGROUND

Modern integrated circuits ("ICs") in production require an enormous volume of components. During the manufacturing process, ICs must be quickly tested to determine whether each integrated circuit is functioning correctly without any physical defects. One approach is scan testing, which allows an initial state to be loaded into an integrated circuit and test to be performed from that initial state.

A specific state can be loaded into an integrated circuit by designing into the integrated circuit a special mode called a "scan mode" where all the state elements in the integrated circuit are chained together into one or more shift registers called scan chains. A design state may be set by scanning data into every flop in the integrated circuit design. The integrated circuit can then be placed on automatic test equipment (ATE), which initializes the integrated circuit to a state (e.g., scan pattern) through the scan chains, applies some tests on the integrated circuit from the state, and then uses the scan chains to unload response data from the integrated circuit after the tests have been applied.

To determine whether an integrated circuit is functioning correctly, unloaded response data from an integrated circuit is compared against a known good response. If the responses do not match, the integrated circuit is identified as faulty. This process is repeated for different scan patterns until the integrated circuit can be validated as functioning defect free.

There are several aspects of scan testing that make it practical. First, it is possible to apply a large number of tests to an integrated circuit in a short amount of time. Second, hardware overhead required to incorporate a scan mode into the integrated circuit is typically not significant compared to functional logic of the integrated circuit. Finally, it is possible to diagnose response data to determine which part of the integrated circuit is failing.

Testing of those ICs requires a large number of test patterns. Transition fault testing has become more prominent, requiring many times more patterns than before. As the chip size and the ratio of logic to be tested per input/output test pin increases dramatically, the amount of data necessary to be supplied by techniques such as automatic test pattern generation ("ATPG") has become voluminous. Design for test ("DFT") designers are faced with the challenge of inputting, for each of these large chips, a huge volume of scan test sequences via a minimal number of test pins. Therefore, with ATPG only, the required test time increases and the required amount of tester memory increases, both of which increase the cost associated with DFT.

In order to address these challenges, DFT designers have used a technique called Test Compression. Test Compression reduces test data volume and test application time ("TAT") while retaining test coverage. Using Test Compression, highly compressed test data can be loaded onto the scan chains from low-pin count automated test equipment ("ATE"), using an on-board Decompressor which decompresses the compressed test data before loading them to a large number of scan chains. After applying the scan chain data to the IC, the response data is then compressed for measurement and comparison. Test Compression recognizes that only a small percentage of scan cells in a scan chain ("care bits") generated by ATPG are necessary for testing, and need to take specific values. The rest of the cells in the scan channel are "don't care," and are usually filled with random values. Care bits are set by test-generating software to target specific or "focal" faults in the logic being tested. Non-care bits are not targeted toward any particular focal fault. Test compression takes advantage of the small number of significant values (care bits) to reduce test data and test time. Test Compression modifies the design to apply the care bits in shorter scan chains, reducing the TAT. The compression ratio generated by Test Compression methods is capable of greatly reducing the test data volume and TAT. For example original data having a volume of 6 Gb and TAT of 20 seconds is, at a 100× compression ratio, reduced by 99% to 60 Mb and TAT of 0.2 seconds.

Test Compression is driven by two structures: a Decompressor and a Compressor (or Compactor). The Decompressor drives the compressed test stimuli onto the IC from the small number of scan-in pins on the ATE to the large number of internal scan channels which feed the logic under test. The Decompressor is designed to allow a continuous flow of stimuli so that it is possible to load the scan chain data for a given test onto the IC and to simultaneously unload from the IC the previous test response data to the Compressor. Compression and De-compression logic generally are built using discrete logic gates such as exclusive ORs (XORs), multiplexers and flip-flops and placed inside a logic module, i.e., Compressor-Decompressor ("CoDec"), which is normally placed in one localized area of the IC. Wires transfer test stimuli from the Decompressor inside the CoDec to the head of the scan channels which may be distributed across the area of the IC. Similarly wires from the tails of the scan channels transfer the test stimuli to the Compressor inside the CoDec. Wiring all of these connections directly between the scan chains scattered over the surface area of the IC and the decompression and compression logic is referred to as traditional global scan wiring.

To form the connections to and from the decompression and compression logic, wires need to be run from every scan chain to the decompression and compression logic. To reduce the cost of testing ICs DFT engineers try to build more scan chains of shorter length to increase the compression ratio. Data may be loaded into the scan chains in parallel. Higher compression ratios means that there are more wires running from the CoDec to the heads and tails of the shorter and more numerous scan chains, The additional wiring can lead to wiring congestion and may even increase the footprint of the IC. The impact is often seen in the area directly around the decompression logic and compression logic, and can result in the use of extremely long wires to form some of the connections. For compression ratios exceeding 100×, congestion is extreme since there is a large number of wires terminating and originating from a small area of compression logic. As the compression ratios increase, driven by increasing chip sizes, traditional global placement of logic is no longer feasible.

Other methods have been introduced in efforts to correct the on-board congestion issues associated with compression logic, such as XOR mapping and partitioned Compressor-Decompressors. However, XOR mapping and partitioned Compressor-Decompressor methods are at best incremental improvements. A 2-dimensional logic intensive distribution may be implemented to optimally divide the testable logic into a 2-dimensional grid of the integrated circuit having a first set of wires, each wire in the first set of wires extending along a first dimension of the grid, and a second set of wires that crosses the set of first wires, each wire in the second set of wires extending along a second dimension of the grid; selection logic that: generates a first set of terms and a second set of terms from the set of scan inputs, assigns each of the generated terms from the first set of terms to different wires in the first set of wires, and assigns each of the generated terms from the second set of terms to different wires in the second set of wires; a set of exclusive OR (XOR) gates, each XOR gate from the set of XOR gates placed in a different region of the integrated circuit in which a wire in the first set of wires crosses a wire in the second set of wires, and each XOR gate input connected to: (i) the wire in the second set of wires and (ii) the wire in the first set of wires, and each XOR gate output connected to at least one scan chain.

Also, as chip complexity increases, compression ratios will ideally increase. However, physical chip layout can prevent implementation of large compression ratios. For example, for a spreader network of a plurality of XOR logic gates (e.g., XOR decompressor), the maximum number of care bits that can be solved for each scan cycle is limited by the total number of scan inputs. At a certain point, physical design can become a bottleneck, limiting the total number of wires that can be manufactured in contact with on-board location of the decompression logic and compression logic. Based on the number of scan inputs, a 2-dimensional grid may be generated on the integrated circuit. Specifically, a bisecting distribution method may be utilized to determine and divide the testable logic into a 2-dimensional grid on the IC in a physically efficient manner such that the application and scanning of test data can be completed most efficiently.

However, such a 2-dimensional grid design results in many interdependencies among the individual grid cells. These correlations in neighboring grid cells negatively impacts and limits the design and physically efficient scans because the associated logic is likely to be functionally correlated as well. Further, the utilization of a 2-dimension grid that uses horizontal and vertical wires to deliver and retrieve test data for each cell results in a decrease in fault coverage, which may make the associated scan testing unusable.

Accordingly a 2-dimensional distribution architecture that minimizes interdependencies between grid cells and the associated functional logic, while improving testability is needed to facilitate the most physically efficient and accurate scans of integrated circuit designs, that simultaneously minimizes required test application time ("TAT"), test data volume, tester memory and cost associated with design for test ("DFT"), but also retains test coverage.

DESCRIPTION OF EMBODIMENTS

Figure 1:
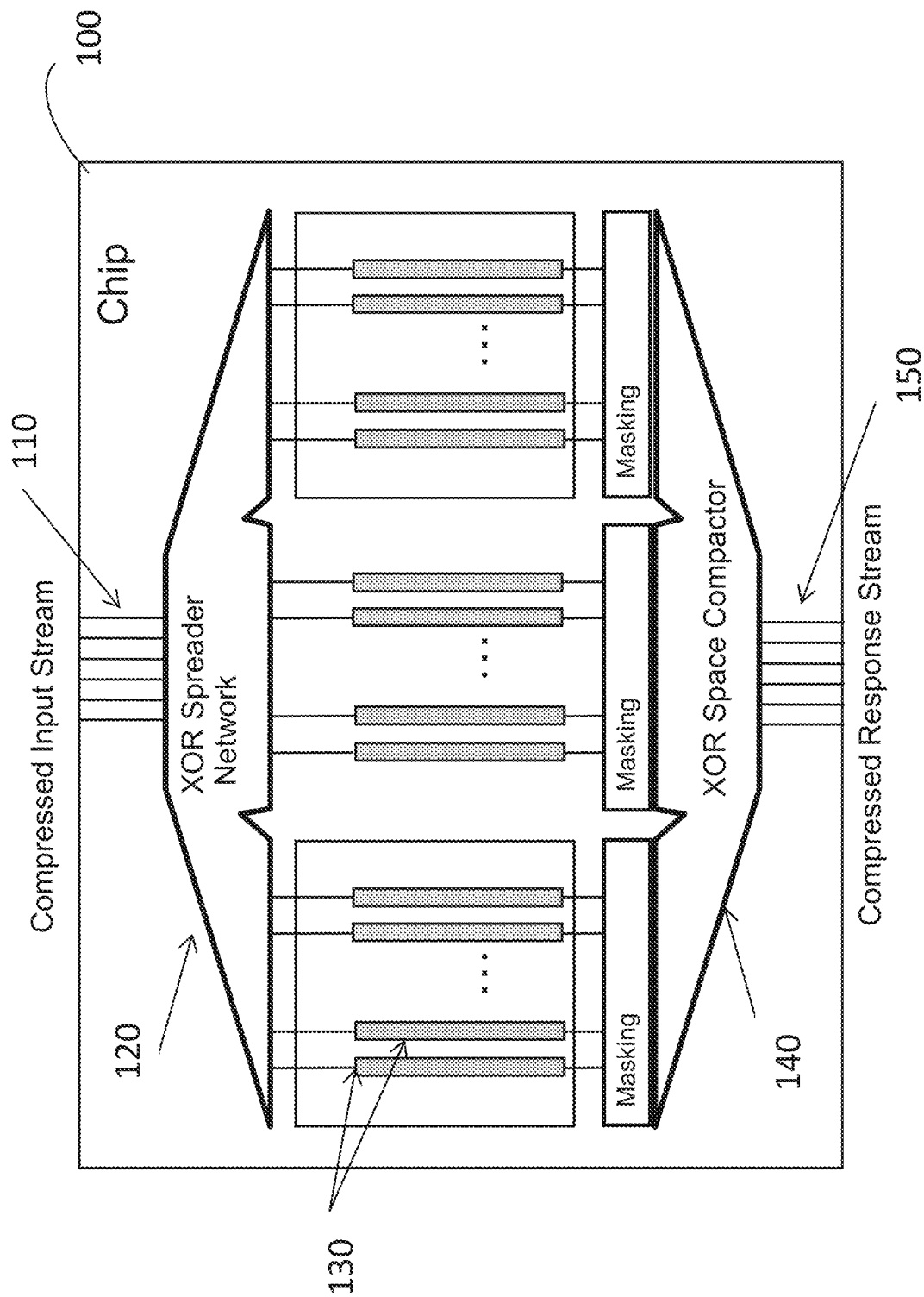
FIG. 1 illustrates a block diagram of the compression logic of a sample integrated circuit according to an implementation of 2-dimensional distribution architecture.

The following description of embodiments provides non-limiting representative examples referencing numerals to particularly describe features and teachings of aspects of the invention. The embodiments described should be recognized as capable of implementation separately, or in combination, with other embodiments from the description of the embodiments. A person of skill in the art reviewing the description of embodiments should be able to learn and understand the different described aspects of the invention. The description of embodiments should facilitate understanding of the invention so that other implementations of aspects of the invention, not specifically described but within the knowledge of a person of skill in the art having read the description of embodiments, would be understood to be consistent with application of aspects of the invention.

One aspect of the present disclosure is to provide a 2-dimensional distribution architecture for testing integrated circuit design that utilizes a double grid to minimize interdependencies between grid cells and the associated functional logic to facilitate the most physically efficient and accurate scans of integrated circuit designs, that simultaneously minimizes required test application time ("TAT"), test data volume, tester memory and cost associated with design for test ("DFT"), while also retaining test coverage. An additional grid parallel to a 2-dimensional XOR grid may be implemented that improves the quality of test coverage by optimally adding additional data input choices which decreases correlations between grid cells. Although a double grid is described throughout, related architectures such as a triple grid, or partial double grid (doubling wires along one dimension only) could also be used.

For example, IC designs may include a second 2-dimensional grid on an integrated circuit that includes a second set of first wires, each wire in the second set of first wires extending parallel to a first set of first wires along a first dimension of a first 2-dimensional grid and a second set of second wires, crossing the second set of first wires, each wire in the second set of second wires extending parallel to a first set of second wires along a second dimension of the first 2-dimensional grid. Input test data may be loaded onto the first set of first wires, the second set of first wires, the first set of second wires, and the second set of second wires, and input test data may be selected from the first wires and the second wires. A term from the selected input test data from the first wires may be combined with a term from the selected input test data from the second wires into a grid term. The first set of terms may be even terms and the second set of terms may be odd terms. The generated grid term may be applied to a local area of the integrated circuit.

In one embodiment, input data may be selected from both the first set of second first and the second set of second wires. A term from the selected input test data from the first wires may be combined with terms from the selected input data from the second wires into a grid term. The input test data may be randomly selected from the first and second wires. A random number generator may be utilized to select the input test data from the first set of first wires, the second set of first wires, the first set of second wires, and the second set of second wires. Also, patterns of correlations between grid cells may be evaluated to select input test data from the first and second wires.

In another aspect, a term from the selected input test data from the first wires may be combined with a term from the selected input test data from the second wires into a grid term is performed by providing the second term and the first term as input to an exclusive OR (XOR) gate. The grid term may be received from the output of the XOR gate. In yet another embodiment, a bisecting distribution scheme that provides a determination of a total amount of wire required to connect compression logic and decompression logic across a grid cell may be implemented.

A system for testing integrated circuits may include a first and second 2-dimensional grids, a row spreader, a column spreader and a CoDec. The first 2-dimensional grid on an integrated circuit may include a first set of row wires along a first dimension of the integrated circuit and a first set of column wires along a second dimension of the integrated circuit crossing the first set of row wires. The second 2-dimensional grid on the integrated circuit may include a second set of row wires, each row wire in the second set of row wires extending parallel to the first set of row wires along the first dimension of the integrated circuit, and a second set of column wires, crossing the second set of row wires, each wire in the second set of column wires extending parallel to the first set of column wires along the second dimension of the integrated circuit. The row spreader may feed data into the first set of row wires and the second set of row wires, and the column spreader may feed data into the first set of column wires and the second set of column wires The CoDec may be placed in a region of the integrated circuit that combines data from the first and second set of row wires with data from the first and second set of column wires. The CoDec may include logic gates and each logic gate input may be connected to a row wire from the first set or wires or from the second set of row wires, and may be connected to at least one column wire from the first set of column wires or the second set of column wires. The logic gate output may be connected to at least one scan chain. In one embodiment, the logic gates may include exclusive OR (XOR) gates. Also the system may include a pattern generator that may provide data to the row spreader and the column spreader.

Distributed test compression logic may be utilized to reduce test data volume and test application time ("TAT"), while simultaneously trying to retain test coverage. Using distributed test compression, highly compressed scan chains may be applied to low-pin count automated test equipment ("ATE"), which may decompress the scan chains to a large number of scan channels that apply data directly to the IC. After applying the scan chain data to the IC, the data may then be compressed for measurement and comparison.

Distributed test compression logic may be implemented on a design for test integrated circuit that may include a 2-dimensional grid of the integrated circuit having a first set of wires, each wire in the first set of wires may extend along a first dimension of the grid, and a second set of wires that may cross the set of first wires. Each wire in the second set of wires may extend along a second dimension of the grid. Selection logic may be utilized that may generate a first set of terms and a second set of terms from the set of scan inputs, may assign each of the generated terms from the first set of terms to different wires in the first set of wires, and may assign each of the generated terms from the second set of terms to different wires in the second set of wires. A set of exclusive OR (XOR) gates may be utilized, and each XOR gate from the set of XOR gates may be placed in a different region of the integrated circuit in which a wire in the first set of wires crosses a wire in the second set of wires, and each XOR gate input may be connected to the wire in the second set of wires and the wire in the first set of wires. Each XOR gate output may be connected to at least one scan chain.

The first set of terms and the second set of terms may be selected in various ways. A designer may designate a term from the scan inputs as a term in one of the first set of terms or the second set of terms. In some embodiments, the designation of terms from the scan inputs may be implemented by routing logic, selection pins, or other equivalent hardware. In some embodiments, all possible terms from the scan inputs may be designated as terms in either the first set of terms or the second set of terms. In one embodiment, not all of the possible terms from the scan inputs are designated in the first set of terms and the second set of terms.

In some embodiments, distributed sequential decompression logic may be referred to as a distributed Decompressor. The Decompressor may be constructed by dividing the input pins into a $2^p$ by $2^q$ 2-dimensional grid where p and q are both integers greater than zero. Therefore, when there are N input bits from the test scan inputs during each clock cycle, there are $2^N$ different total term combinations that are eligible for designation to test from the N input bits during the current cycle. From those $2^N$ different total term combinations, there are $2^{N-1}$ even term combinations and $2^{N-1}$ odd term combinations ($2^{N-1}+2^{N-1}=2^N$).

Odd term combinations and even term combinations refer to subsets of the total terms that can be generated from a set of N input bits. The total number of term combinations that can be generated from the N inputs bits is $2^N$ different total term combinations. For example, if the three input bits include the set of {a, b, c}, the total number of term combinations is the 8 terms: {0, a, b, c, a^b, a^c, b^c, a^b^c}. The even terms combinations from the total number of term combinations includes all terms that have an even number of the original N input bits in them. In the example where N=3, the even term combinations include: {0, a^b, a^c, b^c}. The odd term combinations from the total number of term combinations includes all terms that have an odd number of the original N input bits in them. In the example where N=3, the odd term combinations include: {a, b, c, a^b^c}. When an even term is combined with an odd term, the result of the combination is consistently an odd term. In an embodiment, the design for test integrated circuit is structured such that all of the even terms are combined with all of the odd terms through a set of XOR gates to generate a set of grid terms including every odd term combination possible from the N input bits.

To structure the design for test integrated circuit according to an embodiment, one of p or q may be set such that the even terms are fed along a first side of the grid during the current clock cycle. The first side of the grid refers to a first set of wires included in the grid that each extend along a first dimension of the grid. The other of p or q may be set such that the odd terms are fed along a second side of the grid.

The second side of the grid refers to a second set of wires included in the grid that each extend along a second dimension of the grid. Accordingly, in an embodiment in which all of the even or odd terms are designated as terms in the first set of terms and the second set of terms, respectively, the number of input pins on the p-side (where p=N−1) of the grid is $2^{N-1}$, and the number of input pins on the q-side (where q=N−1) of the grid is $2^{N-1}$. The inputs on a first side of the grid are formed by applying all of the odd terms to the first set of wires. The second set of wires on the second side of the grid receives all of the even terms.

A bisection distribution scheme may be utilized to divide the testable logic into a 2-dimensional grid. The bisection distribution scheme involves construction of an imaginary grid, on the IC, where the logic from a CoDec, which may include XOR logic, can be distributed to points on a grid evenly. Distributing the CoDec to points on a grid evenly is to be understood as meaning that, in each location on the IC, the output/input of the CoDec is provided to and unloaded from the same number of flops for testing scan chains.

Test data available from scan-in pins of the IC is decompressed by initial decompression logic. After decompression, all of the terms available from the scan in pins are available for application to the grid. Column logic distributes the terms needed from the initial test data along a first axis. Row logic distributes the terms needed from the initial test data along a second axis. Placement of the wiring extending from the column logic to each of the different points along the grid, however, is determined in accordance with the bisecting algorithm described further herein. At the point in time when the placement of the grid wiring is determined using the bisecting algorithm, all of the functional logic on the chip has already been implemented, and the flops associated with DFT are implemented on the chip. Only once the bisecting algorithm is completed and the bounds of the grid cells are determined can the wires extending from the column logic be overlaid on to the IC such that there are gates placed in the appropriate locations within the grid cells. Similarly, placement of the wiring extending from the row logic inside of the grid is determined in accordance with the bisecting algorithm. Implementation of the bisecting algorithm can result in code, a schematic, or an image of the bounds of the grid cells within which the compression and decompression logic should be placed. In some embodiments, implementation of the bisecting algorithm results in a determination of the total amount of wire required to connect all of either and/or both of the compression logic across the neighboring grid cells and the decompression logic across the neighboring grid cells.

However, a 2-dimensional grid design may result in many interdependencies among the individual grid cells. These correlations in neighboring grid cells negatively impacts and limits the design and physically efficient scans because the associated logic is likely to be functionally correlated as well. Further, the utilization of a 2-dimension grid that uses horizontal and vertical wires to deliver and retrieve test data for each cell results in a decrease in fault coverage. An additional grid parallel to such a 2-dimension XOR grid may be implemented that improves the quality of test coverage by optimally adding additional data input choices which decreases the correlations between grid cells.

FIG. 1 illustrates a block diagram of a sample integrated circuit 100 according to an implementation of 2-dimensional distribution architecture. Integrated circuit 300 includes a compressed input stream 110. Compressed test data (e.g., stimuli, test pattern, etc.) can be fed into decompression logic via scan inputs from a tester (not shown). The compressed input stream is decompressed (e.g., expanded), and test patterns propagate through the XOR spreader network 120 and populate scan chains 130.

XOR spreader network may include some type of combinational logic fan-out where each scan input feeds a set of scan chains 130. The ratio of the number of scan chains 130 to the number of scan inputs is known as the fan-out. A scan chain is a plurality of latches (e.g., flip-flops) that are wired together. Latches in an integrated circuit are wired into a plurality of scan chains to make it easier to put the integrated circuit into different states for testing purposes. Decompression logic may also include a shift register (not shown) to recycle earlier scan input data or other logic to control how data from scan inputs is distributed to scan chains 130. Response data, which resulted from the test data inputted into scan chains 130, outputs from scan chains into masking logic. Masking logic may then be used to block unknown values in the response data. In another implementation, masking logic may be used to map unknown values in the response data to known values. Once all unknown values in the response data are removed or mapped to known values, XOR space compactor 140 may be used to perform a compression of the response data from scan chains 130 being outputted via compressed response stream 150.

Figure 2:
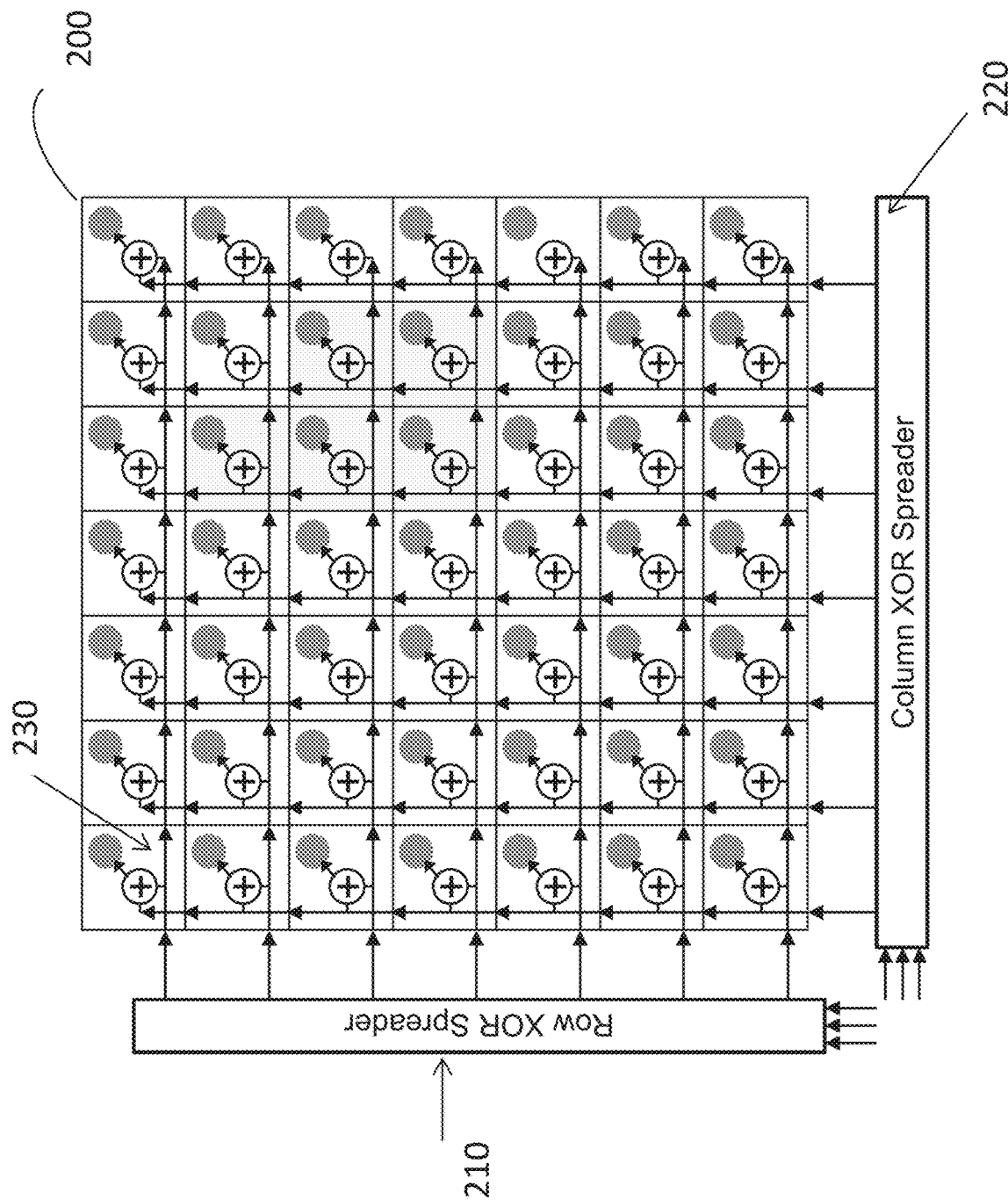
FIG. 2 illustrates distribution of decompression logic over a 2-dimensional integrated circuit by placement of XOR logic over the chip area utilizing a row XOR spreader and a column XOR spreader.

FIG. 2 illustrates distribution of decompression logic over a 2-dimensional integrated circuit by placed of XOR logic over the chip area utilizing a row XOR spreader 210 and a column XOR spreader 220. IC 200 is partitioned into a number of regions. The distributed Decompressor allows for the IC 200 to be partitioned into a grid of Y by X boxes, with some of the decompression logic in each of the boxes. In order to implement the distributed Decompressor, the final XOR stage is implemented so that there are localized XOR gates in each of the boxes. Each XOR, in each box, provides test stimuli from the scan input pins to the scan chains. Each XOR has a wire feeding from the horizontal direction, from Row XOR Combiner. Each XOR further has a wire feeding from the vertical direction, from Column XOR Combiner. The XOR then accepts the wire from the horizontal direction and the wire from the vertical direction as inputs into its gate, e.g., 230. The output of the XOR is provided to its respective scan chain in the grid cell. In an embodiment, the grid cell includes more than one scan chain that receives the output of the XOR gate. In so doing, a unique piece of data is provided for each grid cell. In an embodiment, the distribution of the XOR gates and the division of the grid covers the entire IC 200 area. In another embodiment, the distribution of the XOR gates and the division of the grid covers an area less than the entire IC 200 area.

Figure 3:
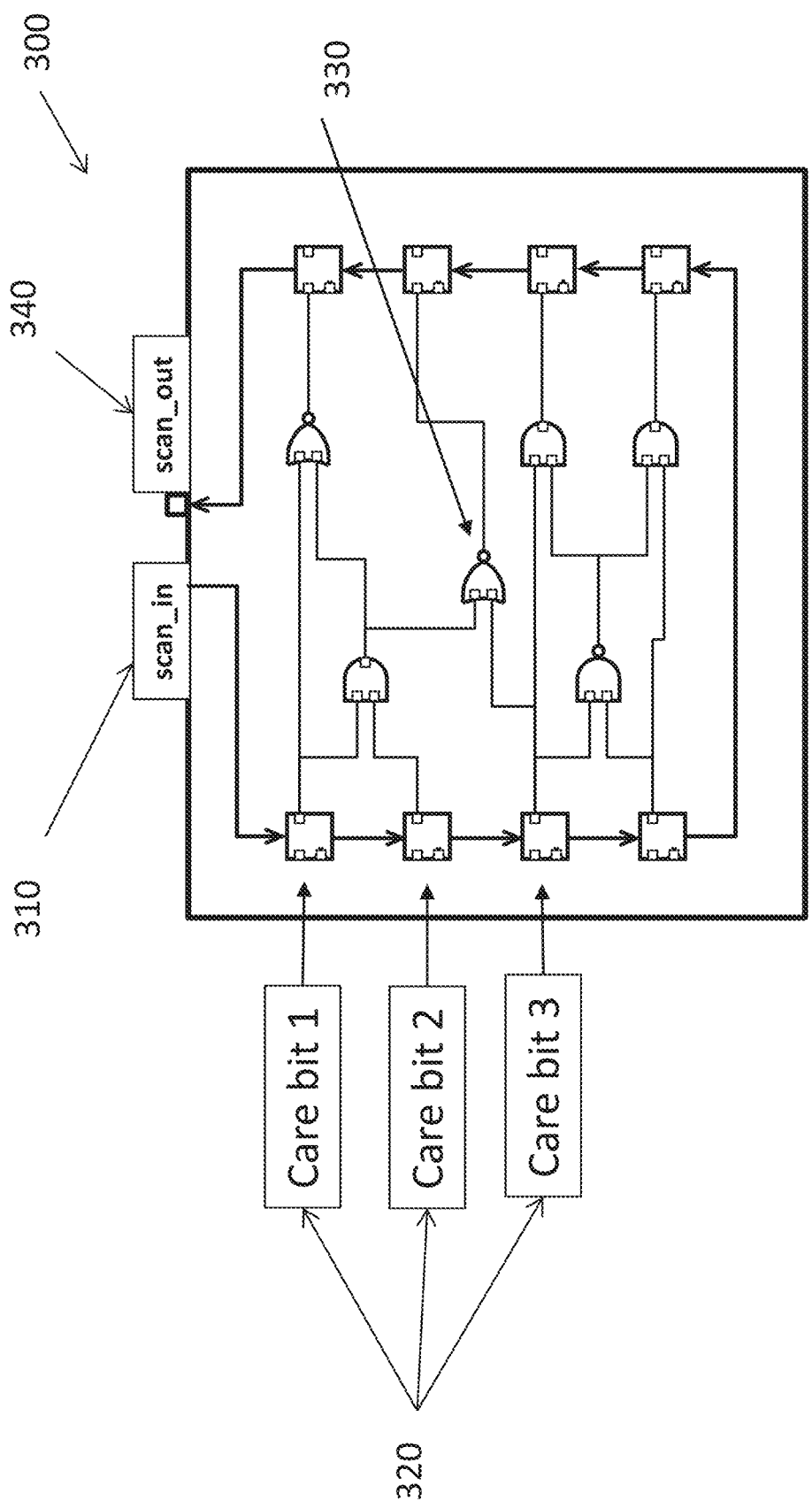
FIG. 3 illustrates the elements of a scan testing network system that will be used by automatic test pattern generation.

FIG. 3 illustrates the elements of a scan testing network system to be used by an automatic test pattern generation process. Care bits 320 may be utilized to test a fault of integrated circuit 300, for example, whether pin 330 is stuck at zero. To test for a fault at pin 330, care bits 320 need to take specific values from scan in data 310. By fanning back through the design, the flops associated with care bits 320 control the node of interest 330 to be able to test whether it is on (value 1) or off (value 0) through scan out data 340. The rest of the cells in the scan channel are "don't care" and are usually filled with random values. Care bits, such as 320, tend to be located close together, which cause interdependencies between the associated grid cells.

Figure 4:
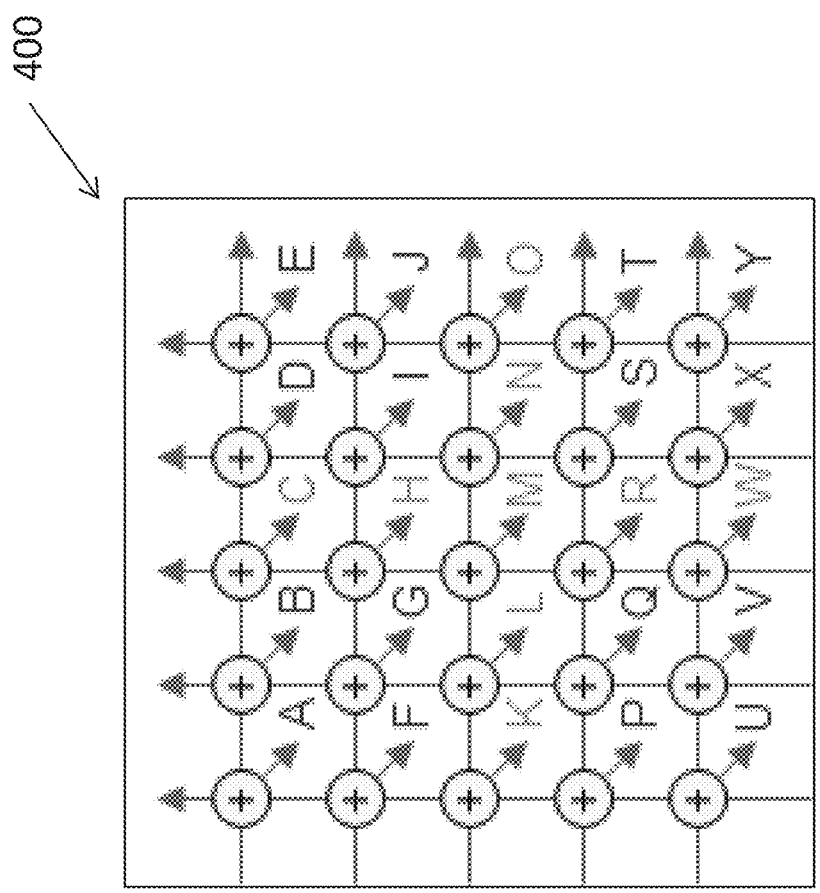
FIG. 4 illustrates a 2-dimensional distribution scheme for dividing testable logic into a 2-dimensional grid on an integrated circuit.

FIG. 4 illustrates a 2-dimensional distribution scheme for dividing testable logic into a 2-dimensional grid on an integrated circuit 400. Because of the way in which the wires cross in 2-dimensional grid, all nearby scan chains may not be able to be set to independent values. As illustrated in FIG.

4, for neighboring chains A, B, F, G, only three of the chains may be set to an independent value, as the fourth will be determined based on the values of the other neighboring 3 chains. For example, if the values of chains B, G, and F are set to a specific value, the value of A is necessarily predetermined and must be set to the XOR value of B, G, and F. Such a limitation of setting scan chain values based on the grid cell interdependencies affects the physical efficiency of the scans as well as results in a loss of test coverage. Such correlations likely result due to the associated logic being functionally correlated as well.

Figure 5:
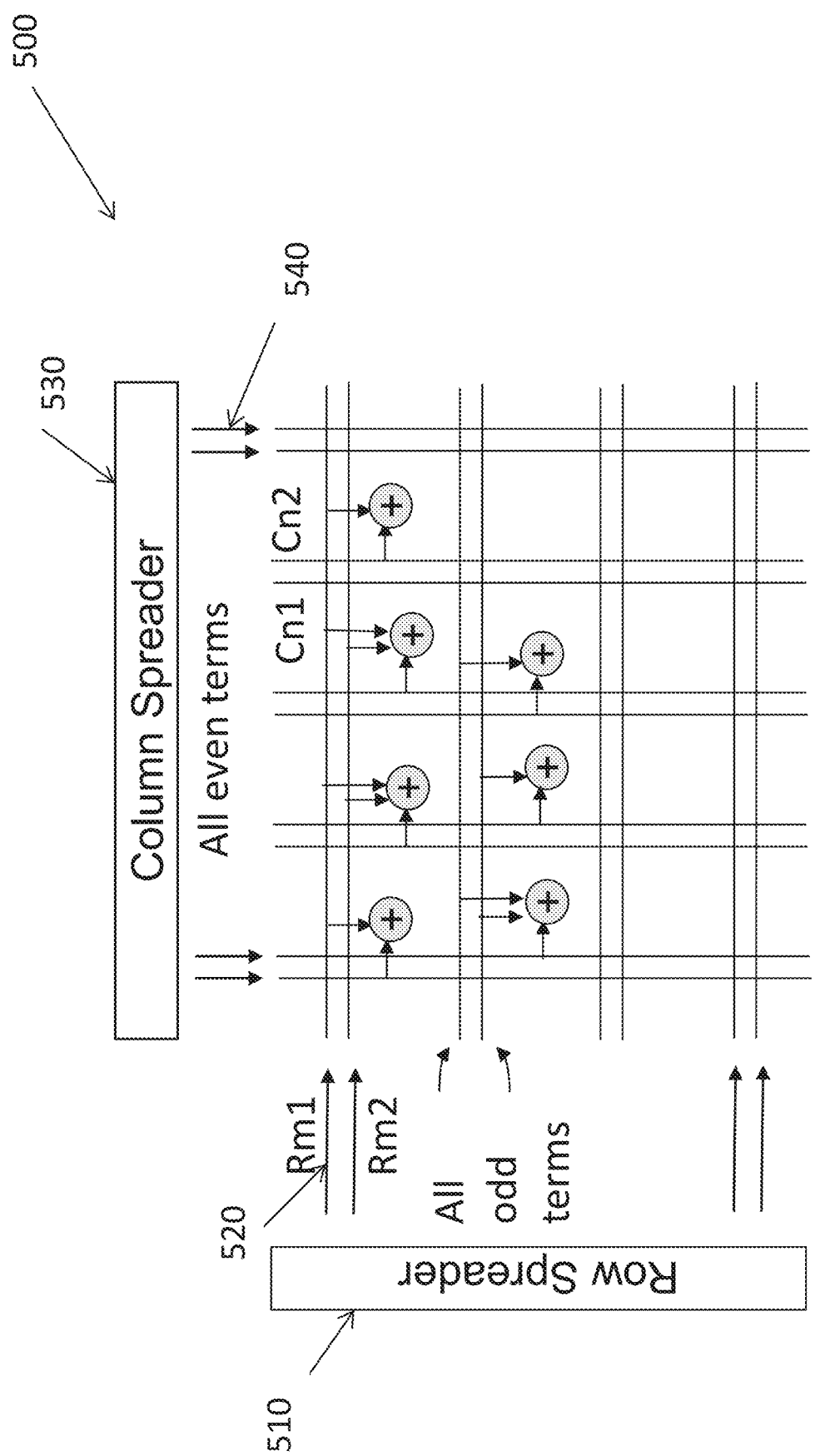
FIG. 5 illustrates an embodiment of an integrated circuit having a double grid for implementing a 2-dimensional compression distribution architecture.

FIG. 5 illustrates an embodiment of an integrated circuit 500 having a double grid for implementing a 2-dimensional distribution architecture. A second set of wires parallel to 2-dimensional grid wires across integrated circuit 500, provides more data that may be input into the grid, which removes some of the interdependencies between scan chains, allowing values for nearby locations to be set more independently. Utilizing a double grid, column spreader 530 may feed data into column wires and row spreader 510 may feed data into row wires. The double grid allows data to be fed into two wires 520 (row), 540 (column), which provides twice as many data wires in each direction to generate data.

In one embodiment, the total number of terms for each scan chain is odd. As such, one wire from the row spreader is selected, which may be combined with either one or both of the wires selected from the column spreader. Specifically, input test data may be selected from one of the row wire inputs 520 (Rm1 or Rm2) and may be combined by XORing the selected row data with data selected from at least one of the column wire inputs 540 (Cn1 and/or Cn2).

An automatic test pattern generation system may randomly determine which row wire input may be selected and which column wire input or inputs may be selected. For example, for each grid one of the odd term wires may be selected, Row m wire 1 (Rm1) or Rows m wire 2 (Rm2), and one or more of the even term wires may be selected, Column n wire 1, Column n wire 2 (Cn1, Cn2) to XOR. As such, the possible combinations of wires to be selected for each grid may include (1) Rm1 and Cn1; (2) Rm1 and Cn2; (3) Rm1, Cn1 and Cn2; (4) Rm2 and Cn1; (5) Rm2 and Cn2; and (6) Rm2, Cn1 and Cn2.

A random number generator may be utilized to assign data inputs. In another embodiment, the automatic test pattern generation system may evaluate pattern of correlations between grid cells to determine which wire inputs to select. The increase in available wire data input selections decreases the likelihood of correlation, while retaining test coverage.

Figure 6:
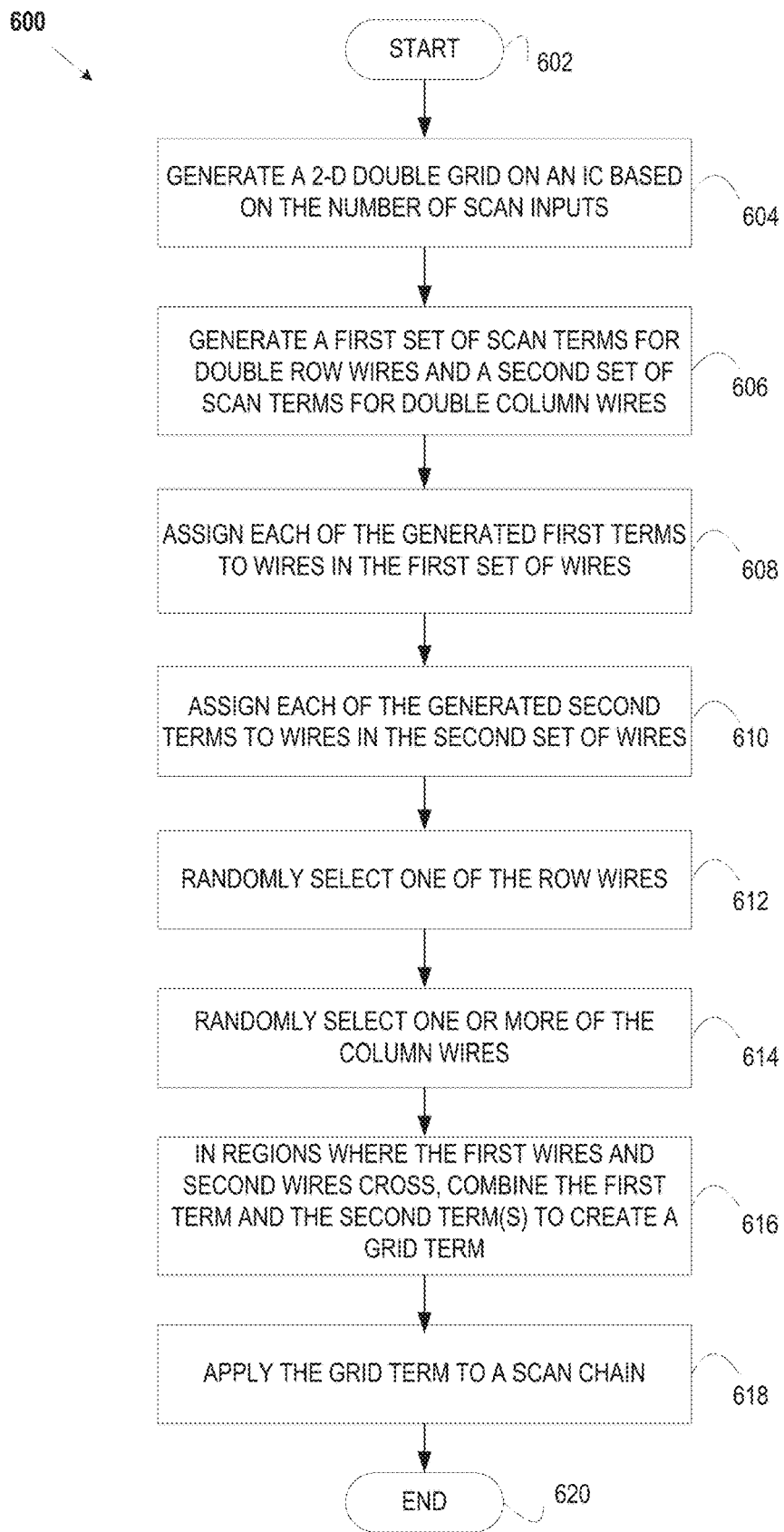
FIG. 6 illustrates a process flow of a method for optimally retaining scan test coverage utilizing a double grid for implementing a 2-dimensional compression distribution architecture.

FIG. 6 illustrates a process flow of a method for optimally retaining scan test coverage utilizing a double grid for implementing a 2-dimensional compression distribution architecture. The process may begin at block 602. According to block 604, a 2-dimensional double grid may be generated on an integrated circuit based on a number of scan inputs. A second set of wires parallel to 2-dimensional grid wires across the integrated circuit, may be utilized to provide more data that may be input into the grid, which removes some of the interdependencies between scan chains, allowing values for nearby locations to be set more independently.

According to block 606, a first set of scan terms for the double row wires and a first set of scan terms for the double column wires may be generated. A column spreader may feed data into column wires and a row spreader may feed data into column wires. At block 608, each of the generated first terms may be assigned to wires in the first set of wires. At block 610, each of the generated second terms may be assigned to the wires in the second set of wires. The double grid allows data to be fed into two wires per row and two wires per column, which provides twice as many data wires in each direction to generate data.

At block 612, one of the row wires may be randomly selected to supply the associated input test data, and at block 614 one or more of the column wires may be randomly selected to supply the associated input test data. In regions where the first wires and the second wires cross, the first term and the one or more second terms may be combined to create a grid term, according to block 616. Specifically, the first term and the one more second terms may be combined by XORing the selected row data with the data selected from the one or more column inputs. The resulting grid term may be applied to a scan chain at block 618.

The process may end at block 620.

Figure 7:
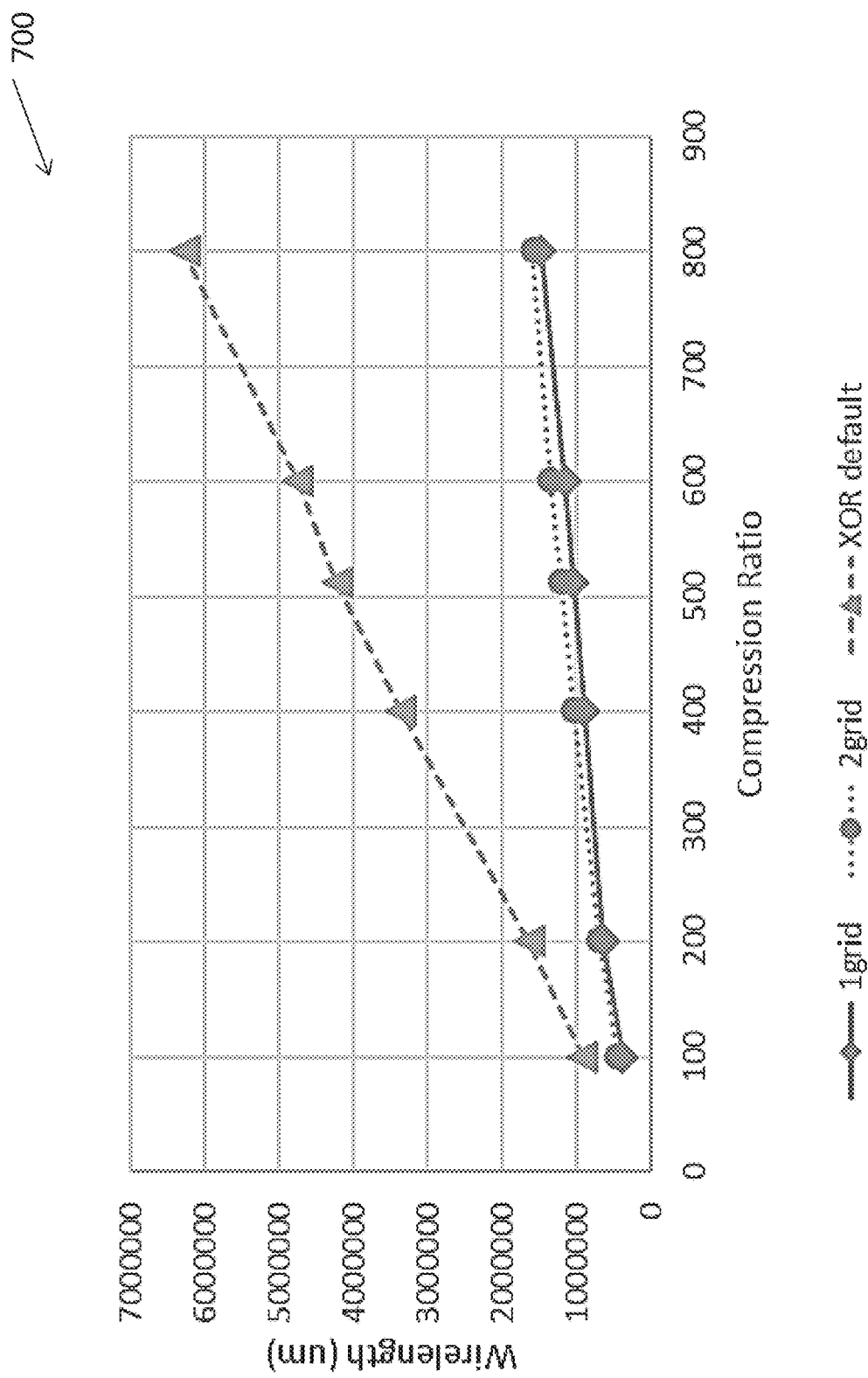
FIG. 7 illustrates the difference in wire length (along the Y-axis) to the compression ratio along the X-axis) of a traditional XOR grid, a 2-dimensional XOR grid and a double 2-dimensional XOR grid.

FIG. 7 illustrates the difference 700 in wire length (along the Y-axis) to the compression ratio along the X-axis) of when compression logic is wired using traditional XOR grid versus a 2-dimensional XOR grid versus a double 2-dimensional XOR grid. As shown, as the compression ratio increases, the wire length increases. Utilizing a double 2-dimensional XOR grid may optimize the amount of overall wiring that is required. Even though two grids are being built, the extra grid is only needed on the decompressor. When optimized through a synthesis engine, the overall increase in total wiring is still much less that used by a traditional XOR CoDec. This results in less wire congestion and consequently less congestion in the grid design.

Some of the foregoing embodiments refer to algorithms, sequences, macros, and operations that require execution of instructions and the usage of a memory. Execution of the instructions stored in memory may be performed by a processing device of an apparatus, the processing device specific to the apparatus. The apparatus hosting the processing device may be in some circumstances the ATE, or in other circumstances, the IC. The processing device executes, or selectively activates in order to execute, a computer program. The computer program is stored in memory associated with the apparatus. Memory available on the apparatus may include a computer readable storage medium, which is not limited to, but may include, any type of disk, including floppy disks, optical disks, CD-ROMs, magnetic-optical disks, read-only memories (ROMs), random access memories (RAMs), electrically erasable programmable read-only memory (EEPROM), flash memory, magnetic or optical cards, or an type of media that stores electronic instructions. Each of the memory devices implemented in the apparatus is further connected to or coupled to a system bus or a network connection, wired or unwired, capable of facilitating or driving communications.

In the foregoing Description of Embodiments, various features are grouped together in a single embodiment for purposes of streamlining the disclosure. This method of disclosure is not to be interpreted as reflecting an intention that the claims require more features than are expressly recited in each claim. Rather, as the following claims reflect, inventive aspects lie in less than all features of a single foregoing disclosed embodiment. Thus, the following claims are hereby incorporated into this Description of the Embodiments, with each claim standing on its own as a separate embodiment of the invention.

Moreover, it will be apparent to those skilled in the art from consideration of the specification and practice of the present disclosure that various modifications and variations can be made to the disclosed systems and methods without departing from the scope of the disclosure, as claimed. Thus, it is intended that the specification and examples be considered as exemplary only, with a true scope of the present disclosure being indicated by the following claims and their equivalents.

What is claimed is:

1. A method, implemented by a computer, for testing an integrated circuit, the method comprising:
generating a first 2-dimensional grid on an integrated circuit, the first 2-dimensional grid including:
a first set of first wires, each wire in the first set of first wires extending parallel to a second set of first wires along a first dimension of a second 2-dimensional grid; and
a first set of second wires, crossing the first set of first wires, each wire in the first set of second wires extending parallel to a second set of second wires along a second dimension of the second 2-dimensional grid;
loading input test data onto the first set of first wires, the second set of first wires, the first set of second wires, and the second set of second wires;
generating a grid term by combining a first input test data term from the first wires with a second input test data term from the first set of second wires and with a third input test data term from the second set of second wires;
loading scan chain data for a test onto the integrated circuit at least in part by shifting the grid term through a scan chain; and
outputting, via a compressed response stream, response data that is based on the scan chain data.

2. The computer implemented method of claim 1, further comprising randomly selecting input test data from the first wires and the second wires.

3. The computer implemented method of claim 2, further comprising utilizing a random number generator to load input test data onto the first set of first wires, the second set of first wires, the first set of second wires, and the second set of second wires.

4. The computer implemented method of claim 1, further comprising evaluating patterns of correlations between grid cells to select input test data from the first and second wires.

5. The computer implemented method of claim 1, further comprising generating a first set of terms and a second set of terms for the scan inputs.

6. The computer implemented method of claim 5, wherein the first set of terms are even terms and the second set of terms are odd terms.

7. The computer implemented method of claim 1, wherein the grid term is generated by combining the first, second, and third input test data terms using an exclusive OR (XOR) gate.

8. The computer implemented method of claim 7, further comprising receiving the grid term from the output of the XOR gate.

9. The computer implemented method of claim 1, further comprising implementing a bisecting distribution scheme that provides a determination of a total amount of wire required to connect compression logic and decompression logic across a grid cell.

* * * * *